(12) United States Patent
Aggus et al.

(10) Patent No.: US 8,175,757 B2
(45) Date of Patent: May 8, 2012

(54) SELF-CLEANING CHASSIS (75) Inventors: Trevor J. Aggus, Lincroft, NJ (US);
Helane F. Daniels, Red Bank, NJ (US);
Linda Derechailo, Keyport, NJ (US);
Richard Jaccard, Morganville, NJ (US);
Roman Kelbert, Rishon Lezion, IL
(US); Steve Mak, Leonardo, NJ (US);
Charles Truax, Ocean, NJ (US); **Niv
Zilberman**, West Orange, NJ (US)

(73) Assignee: Avaya Inc., Basking Ridge, NJ (US)

( * ) Notice: Subject to any disclaimer, the term of this patent is extended or adjusted under 35 U.S.C. 154(b) by 302 days.

(21) Appl. No.: 12/557,340

(22) Filed: Sep. 10, 2009

(65) Prior Publication Data
US 2011/0060471 A1 Mar. 10, 2011

(51) Int. Cl.
*G05D 23/00* (2006.01)

(52) U.S. Cl. ........ 700/300; 700/299; 165/287; 361/695; 236/49.3

(58) Field of Classification Search ................ 700/282, 700/300–301, 299; 165/287, 303; 361/687, 361/683, 695; 236/49.3
See application file for complete search history.

(56) References Cited

U.S. PATENT DOCUMENTS

| | | | | |
|---|---|---|---|---|
| 5,014,908 A | * | 5/1991 | Cox | 236/44 E |
| 5,226,285 A | * | 7/1993 | Dankowski | 62/184 |
| 5,346,518 A | * | 9/1994 | Baseman et al. | 96/126 |
| 6,126,079 A | * | 10/2000 | Shoemaker | 236/35 |
| 6,532,151 B2 | * | 3/2003 | Osecky et al. | 361/679.48 |
| 6,840,974 B2 | | 1/2005 | Bailey | |
| 7,455,706 B2 | * | 11/2008 | Latham et al. | 55/385.1 |
| 7,520,444 B1 | | 4/2009 | Hall et al. | |
| 7,522,834 B2 | | 4/2009 | Heaven et al. | |
| 7,806,344 B2 | * | 10/2010 | Chang | 236/49.3 |
| 2002/0101714 A1 | * | 8/2002 | Osecky et al. | 361/687 |
| 2003/0093602 A1 | * | 5/2003 | Chou et al. | 710/260 |
| 2006/0080982 A1 | * | 4/2006 | Reichle | 62/181 |
| 2006/0092609 A1 | | 5/2006 | Mandel et al. | |
| 2007/0095522 A1 | * | 5/2007 | Chang | 165/287 |
| 2007/0131409 A1 | | 6/2007 | Asahi | |
| 2009/0009960 A1 | * | 1/2009 | Melanson et al. | 361/687 |
| 2009/0071327 A1 | * | 3/2009 | Latham et al. | 95/22 |

OTHER PUBLICATIONS

Extended European Search Report for European Patent Application No. 10175951.2, dated May 30, 2011 8 pages.

* cited by examiner

*Primary Examiner* — Ramesh Patel
(74) *Attorney, Agent, or Firm* — Sheridan Ross P.C.

(57) ABSTRACT

A temperature control system and methods that remove dust or debris from inside an electrical equipment chassis are provided. One or more fans are placed in or near the exterior of the chassis. The fans are operated either in reverse, forward, pulsing, or reverse pulsing modes to create turbulent air flow through the chassis. The change in air flow pattern helps dislodge dust and particles. Once airborne, the fans can exhaust the dust and particles. Further, some embodiments provide vanes or other elements to further direct air flow. The temperature control system can be used in any electrical equipment that is ventilated with fans. The temperature control system provides the advantage of a low cost and efficient method for ensuring that dust does not accumulate on components within an enclosure.

20 Claims, 9 Drawing Sheets

SELF-CLEANING CHASSIS

BACKGROUND

Electrical equipment requires a certain temperature range to operate properly. To maintain the temperature range, fans are generally placed into the chassis (the enclosure that houses the electrical equipment) of the electrical equipment to exhaust hot air and intake cooler air. Unfortunately, the fans generally also intake dust and other small particles. The dust and small particles can accumulate within the chassis of the electrical equipment. In some situations, the dust forms a dust ball that can trap heat or short circuit components within the chassis. To combat dust, many electrical equipment chassis include a filter to remove dust or particles from the ingested air. Unfortunately, filters require periodic maintenance and replacement that creates additional costs for electrical equipment users.

SUMMARY

It is with respect to the above issues and other problems that the embodiments presented herein were contemplated. Embodiments presented herein generally relate to a temperature control system and methods that remove dust or debris from inside electrical equipment chassis. One or more fans are placed in or near the exterior of the chassis. The fans are operated either in reverse, forward, pulsing, or reverse pulsing modes to create turbulent air flow through the chassis. The change in air flow pattern helps dislodge the dust and particles. Once airborne, the fans can exhaust the dust and particles. Further, some embodiments provide vanes or other elements to further direct air flow. The embodiments can be used in any electrical equipment that is ventilated with fans. The embodiments provide the advantage of a low cost and efficient method for ensuring that dust does not accumulate on components within the chassis.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage that participates in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, or any other medium from which a computer can read. When the computer-readable media is configured as a database, it is to be understood that the database may be any type of database, such as relational, hierarchical, object-oriented, and/or the like. Accordingly, the invention is considered to include a tangible storage medium and prior art-recognized equivalents and successor media, in which the software implementations of the present invention are stored.

The terms "determine", "calculate" and "compute," and variations thereof, as used herein, are used interchangeably and include any type of methodology, process, mathematical operation or technique.

The term "module" as used herein refers to any known or later developed hardware, software, firmware, artificial intelligence, fuzzy logic, or combination of hardware and software that is capable of performing the functionality associated with that element. Also, while the invention is described in terms of exemplary embodiments, it should be appreciated that individual aspects of the invention can be separately claimed.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

The ensuing description provides embodiments only, and is not intended to limit the scope, applicability, or configuration of the invention. Rather, the ensuing description will provide those skilled in the art with an enabling description for implementing the embodiments. It being understood that various changes may be made in the function and arrangement of elements without departing from the spirit and scope of the invention as set forth in the appended claims.

Figure 1:
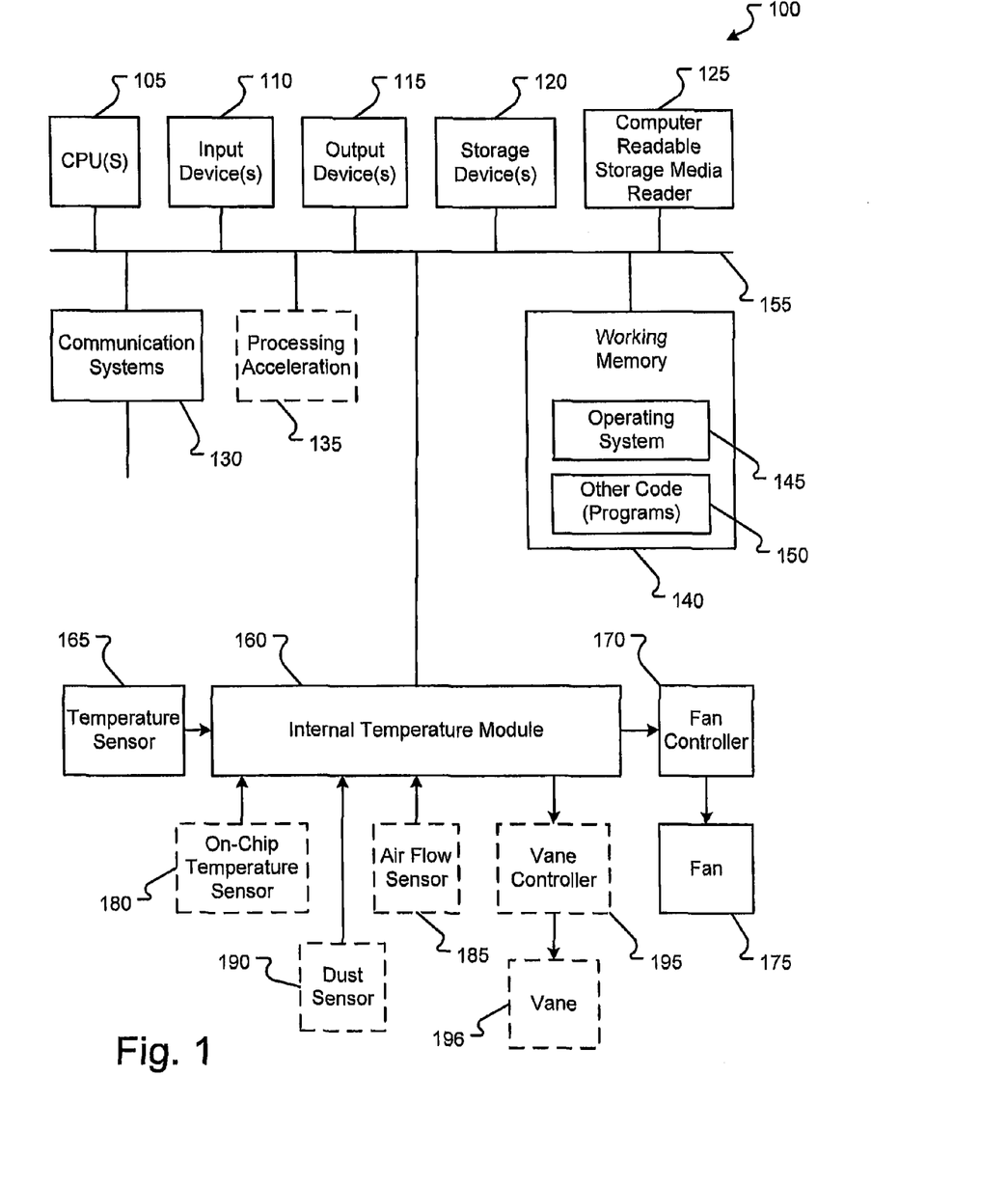
FIG. 1 is a block diagram of a computing system including the temperature control system.

FIG. 1 illustrates one embodiment of a computer system 100 which may form the electrical equipment housed in a chassis. It should be noted that the embodiments presented herein may function with any type of electrical equipment or heat generating devices housed in an enclosure. The computer system 100 is presented only as an example. The computer system 100 is shown comprising hardware elements that may be electrically coupled via a bus 155. The hardware elements may include one or more central processing units (CPUs) 105; one or more input devices 110 (e.g., a mouse, a keyboard, etc.); and one or more output devices 115 (e.g., a display device, a printer, etc.). The computer system 100 may also include one or more storage devices 120. By way of example, storage device(s) 120 may be disk drives, optical storage devices, solid-state storage devices, such as random access memory ("RAM") and/or a read-only memory ("ROM"), which can be programmable, flash-updateable and/or the like.

The computer system 100 may additionally include a computer-readable storage media reader 125; a communications system 130 (e.g., a modem, a network card (wireless or wired), an infra-red communication device, etc.); and working memory 140, which may include RAM and ROM devices as described above. In some embodiments, the computer system 100 may also include a processing acceleration unit 135, which can include a DSP, a special-purpose processor and/or the like The computer-readable storage media reader 125 can further be connected to a computer-readable storage medium, together (and, optionally, in combination with storage device (s) 120) comprehensively representing remote, local, fixed, and/or removable storage devices plus storage media for temporarily and/or more permanently containing computer-readable information. The communications system 130 may permit data to be exchanged with the network 120 and/or any other computer described above with respect to the system 100. Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information.

The computer system 100 may also comprise software elements, shown as being currently located within a working memory 140, including an operating system 145 and/or other code 150, such as program code implementing the ancillary server 300. It should be appreciated that alternate embodiments of a computer system 100 may have numerous variations from that described above. For example, customized hardware might also be used and/or particular elements might be implemented in hardware, software (including portable software, such as applets), or both. Further, connection to other computing devices such as network input/output devices may be employed.

The computing system 100 can also include a temperature management system that includes an internal temperature module 160. While the internal temperature module 160 is shown separate from the CPU 105, the internal temperature module 160 can function as a module executed by the CPU 105. The internal temperature module 160 can be hardware and/or software operable to measure and maintain the internal temperature of an enclosure housing the computing system 100. In embodiments, the internal temperature module 160 receives sensor data and reacts to the sensor data to adjust fan operation to change the air flow within the enclosure or chassis. The operation of the fans may be dynamic depending on the data coming from the sensors. Thus, the exact method for how to operate the fans is variable depending on data collected during fan operation or historic data on how best to cool the chassis or components within the chassis.

The temperature management system can include sensors, for example, one or more temperature sensors 165, one or more on-chip temperature sensors 180, one or more optical dust sensors 190, one or more air flow sensors 185, etc. These sensors are known and will not be explained in detail herein. Importantly, the sensors provide data on the function and temperature of components in the chassis or the temperature of the chassis in general. Further, the sensors can provide data on fan operation.

To control the air flow within the chassis, the internal temperature module 160 communicates with a fan controller 170, which may be a hardware and/or software component. The fan controller 170 is operable to control discretely the one or more fans 175 that are either placed in a side of the enclosure or vent air to the external environment from within the enclosure. The fan controller 170 controls the fans discretely by controlling each fan separately. Thus, one fan may be pulsed while another fan is reversed. Notably, the fan controller 170 can cause one or more fans to operate in clockwise rotation, to operate in counterclockwise rotation, to operate in pulsing rotation, to stop rotation, or to change the fan speed. Further, if the enclosure includes two or more fans, each fan may be controlled separately from the other fans. The control of the fans is dependent on and in response to signals sent from the internal temperature module 160.

In some embodiments, the internal temperature module 160 also communicates with a vane controller 195 that controls one or more vanes 196. A vane can be a louver that changes the direction of air flow into the fans or an air foil placed inside the enclosure that can direct air flow within the enclosure. Thus, the vane controller 195, in response to signals from the internal temperature module 160, can change the orientation of the vanes 196 by rotating or manipulating the vanes 196.

Figure 2:
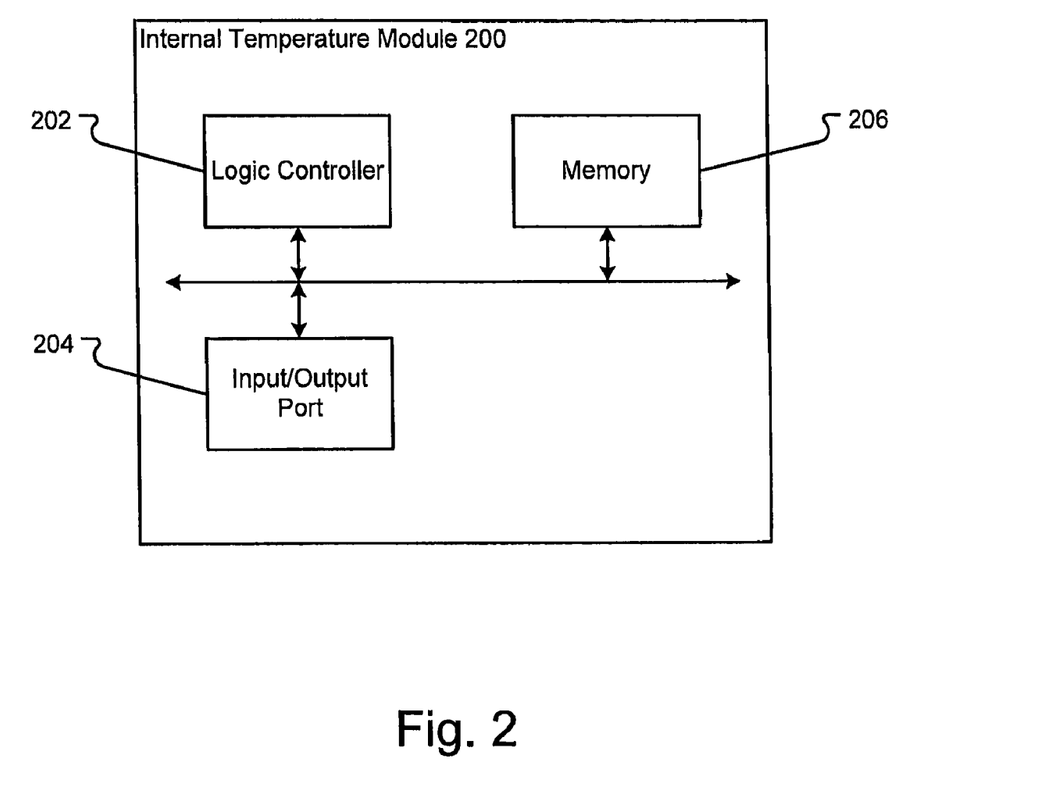
FIG. 2 is a block diagram of an embodiment of an internal temperature module operable to control the interior temperature of a chassis.

An embodiment of an internal temperature module 200, which may be the same or similar to internal temperature module 160 (FIG. 1), is shown in FIG. 2. As explained in conjunction with FIG. 1, the internal temperature module 200 may be a discrete component or a function of or part of the CPU 105 (FIG. 1). The internal temperature module 200 can be hardware and/or software elements. In embodiments, the internal temperature module 200 comprises a logic controller 202, memory 206, and an input/output port 204. The logic controller 202 executes instructions to determine if the fan operation needs to change based on sensor data. Embodiments of methods executed by the logic controller are explained in conjunction with FIGS. 3 and 4. The memory 206 includes any memory as described in conjunction with FIG. 1 that allows the internal temperature module 200 to store computer-executable instructions or data for the logic controller 202. In embodiments, the memory can store historical temperature data that shows trends or shows the best method for cooling one or more components within the enclosure. The input/output port 204 includes any communication component or module as explained in conjunction with FIG. 1 for communicating with the sensors, the fan controller 170, or the vane controller 195.

Figure 3:
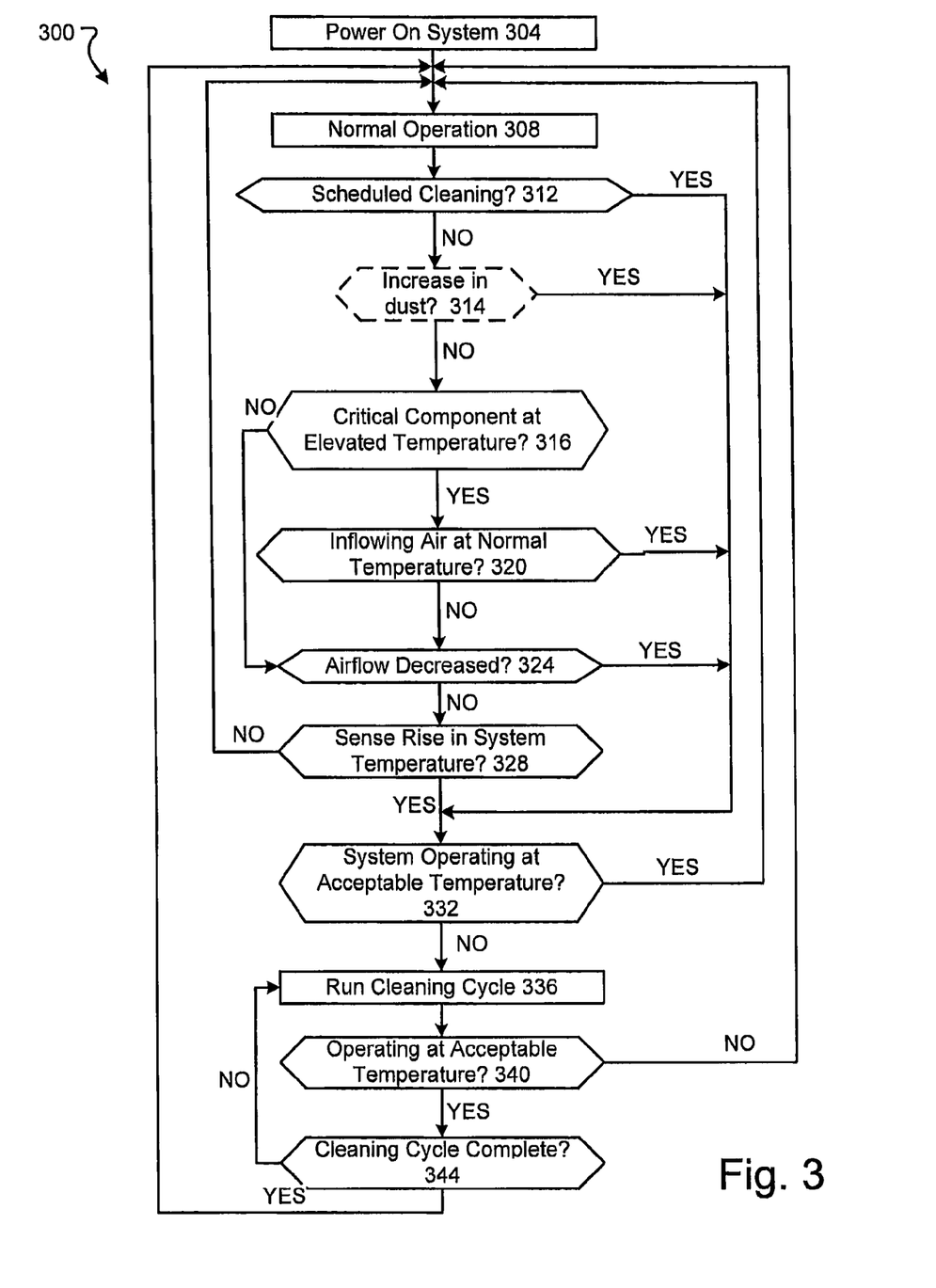
FIG. 3 is a flow diagram of an embodiment of a process for maintaining temperature in a chassis.

An embodiment of a method 300 for maintaining a temperature range in an enclosure is shown in FIG. 3. Generally, the method 300 begins with a start operation and terminates with an end operation. While a general order for the steps of the method 300 are shown in FIG. 3, the method 300 can include more or fewer steps or arrange the order of the steps differently than those shown in FIG. 3. The method 300 can be executed as a set of computer-executable instructions executed by a computer system, such as the internal temperature module 160, and encoded or stored on a computer readable medium. Hereinafter, the method 300 shall be explained with reference to the systems, components, modules, data structures, etc. described in conjunction with FIGS. 1-2.

The computer system 100 powers up in step 304. Power on includes providing electrical power to the components, including the internal temperature module 160, and completing any tests and initializations. After power up, the computer system 100 operates normally in step 308. The internal temperature module 160 may then determine if there is a schedule cleaning for the enclosure housing the computer system 100 in step 312. Cleaning is a process of modifying air flow through the enclosure to eliminate dust and debris or keep the dust from accumulating in any one area. The cleaning may be periodic, e.g., every day, every week, etc. If there is a schedule cleaning for the enclosure housing, the method 300 flows YES to step 332. If there is no schedule cleaning for the enclosure housing, the method flows NO to step 316.

Continuously or at predetermined intervals, the internal temperature module 160 receives temperature data from on-chip temperature sensors 180 that may be affixed to critical components. This temperature data is compared to a temperature threshold in step 316. The threshold may be set by the computer system user or the manufacturer. If the temperature is above the threshold, the component is at an elevated temperature. If the component is at an elevated temperature, the method 300 flows YES to step 320. If the component is not at an elevated temperature, the method 300 flows NO to step 324.

As with the temperature sensors 180, the internal temperature module 160 can receive temperature data, continuously or periodically from temperature sensors 165 that measure the temperature of the air intake. As with step 316, this air intake temperature data is compared to a predetermined temperature threshold in step 320. The threshold may be set by the computer system user. If the temperature is above the threshold, the air intake is at an elevated temperature. If the air intake is at a normal temperature, the method 300 flows YES to step 332. If the air intake is at an elevated temperature, the method 300 flows NO to step 324.

The internal temperature module 160 also receives data, continuously, periodically, at an occurrence of an event (drastic change in data), from one or more air flow sensors 185. This air flow data is compared to a threshold in step 324. The threshold may be set by the computer system user. If the air flow is above the threshold, the air flow is normal, and the method 300 flows NO to step 328. If the air flow is decreased, the method 300 flows YES to step 332.

As with the temperature sensors 165 at the air intake, the internal temperature module 160 can receive temperature data, continuously or periodically from temperature sensors 165 that measure the temperature of the enclosure environment. This enclosure temperature data is analyzed to determine if the temperature in the enclosure has risen in step 328. The internal temperature module 200 can look for a general increase in temperature over two or more measurements. If the enclosure temperature has risen, the enclosure is heating, possibly due to a problem. If the enclosure temperature has risen, the method 300 flows YES to step 332. If the enclosure temperature has not risen or stayed constant, the method 300 flows NO back to step 308 to monitor the enclosure again at a later time.

As with the temperature sensors 165 at the air intake, the internal temperature module 160 can receive temperature data, continuously or periodically from temperature sensors 165 and compare the temperature to a predetermined temperature threshold in step 332. The threshold may be set by the computer system user. If the enclosure temperature is above the threshold, the enclosure is at an elevated temperature. If the enclosure temperature is acceptable (within normal operating limits), the method 300 flows YES to step 336. If the enclosure temperature is above acceptable temperature limits, the method 300 flows NO back to step 308 to troubleshoot the temperature problem.

The internal temperature module 160 can run a cleaning cycle for the enclosure in step 336. An embodiment of a cleaning cycle is explained in conjunction with FIG. 4. The cleaning cycle can be run in response to an event (elevated temperature, decreased air flow, increased dust detected, etc.) or periodically. The cleaning cycle attempts to displace the collected dust in the enclosure. Because every system is different in the configuration of the components within the enclosure and the number and orientation of the fans, louvers, vanes, etc., how the cleaning cycle operates will vary. However, some general principles are provided with FIG. 4 that will eliminate any unnecessary testing to determine how to operate a cleaning cycle.

After the cleaning cycle, the internal temperature module 160 can check the operating temperature of the enclosure again. The internal temperature module 160 receives temperature data as with step 332 and again compares it to a threshold. If the enclosure temperature is acceptable (within normal operating limits), the method 300 flows YES to step 344. If the enclosure temperature is above acceptable temperature limits, the method 300 flows NO back to step 308 to troubleshoot the temperature problem. The internal temperature module 160 completes the cleaning cycle in step 344. If the cleaning cycle is complete, the method 300 flows YES to step 308. If the cleaning cycle is not complete, the method 300 flows YES back to step 336.

Figure 4:
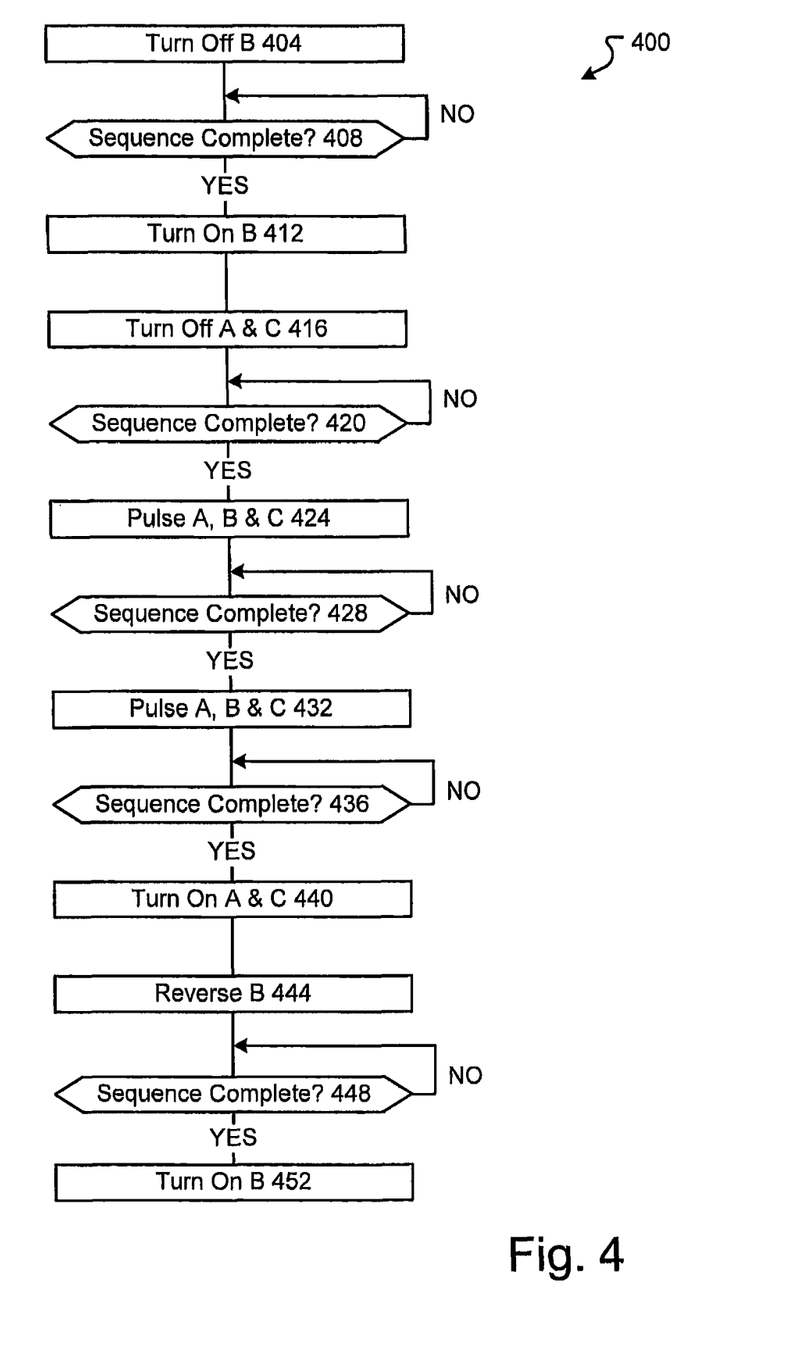
FIG. 4 is a flow diagram of an embodiment of a process for cleaning dust from the inside of a chassis.

An exemplary embodiment of a method 400 for cleaning dust and particles from an enclosure is shown in FIG. 4. Generally, the method 400 begins with a start operation and terminates with an end operation. While a general order for the steps of the method 400 are shown in FIG. 4, the method 400 can include more or fewer steps or arrange the order of the steps differently than those shown in FIG. 4. The method 400 can be executed as a set of computer-executable instructions executed by a computer system, such as the internal temperature module 160, and encoded or stored on a computer readable medium. Hereinafter, the method 400 shall be explained with reference to the systems, components, modules, data structures, etc. described in conjunction with FIGS. 1-2 and with reference to the exemplary chassis enclosure shown in FIGS. 5 through 9. It should be noted that this is an exemplary cleaning method. Cleaning cycles will vary based on the configuration of the components within the enclosure and the number and orientation of the fans, louvers, vanes, etc.

Figure 5:
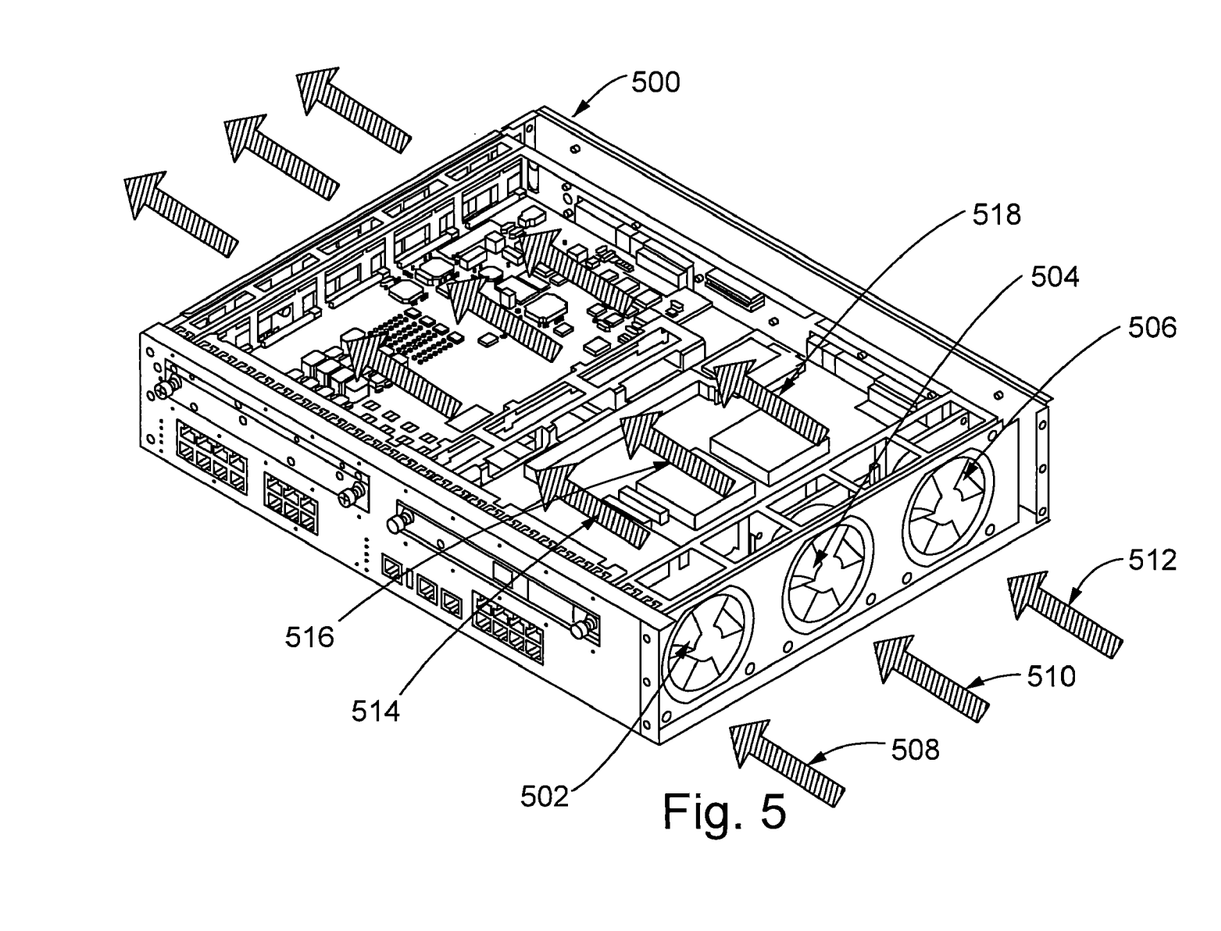
FIG. 5 is a first isometric view of an exemplary chassis showing air flow through the interior of the chassis.
Figure 6:
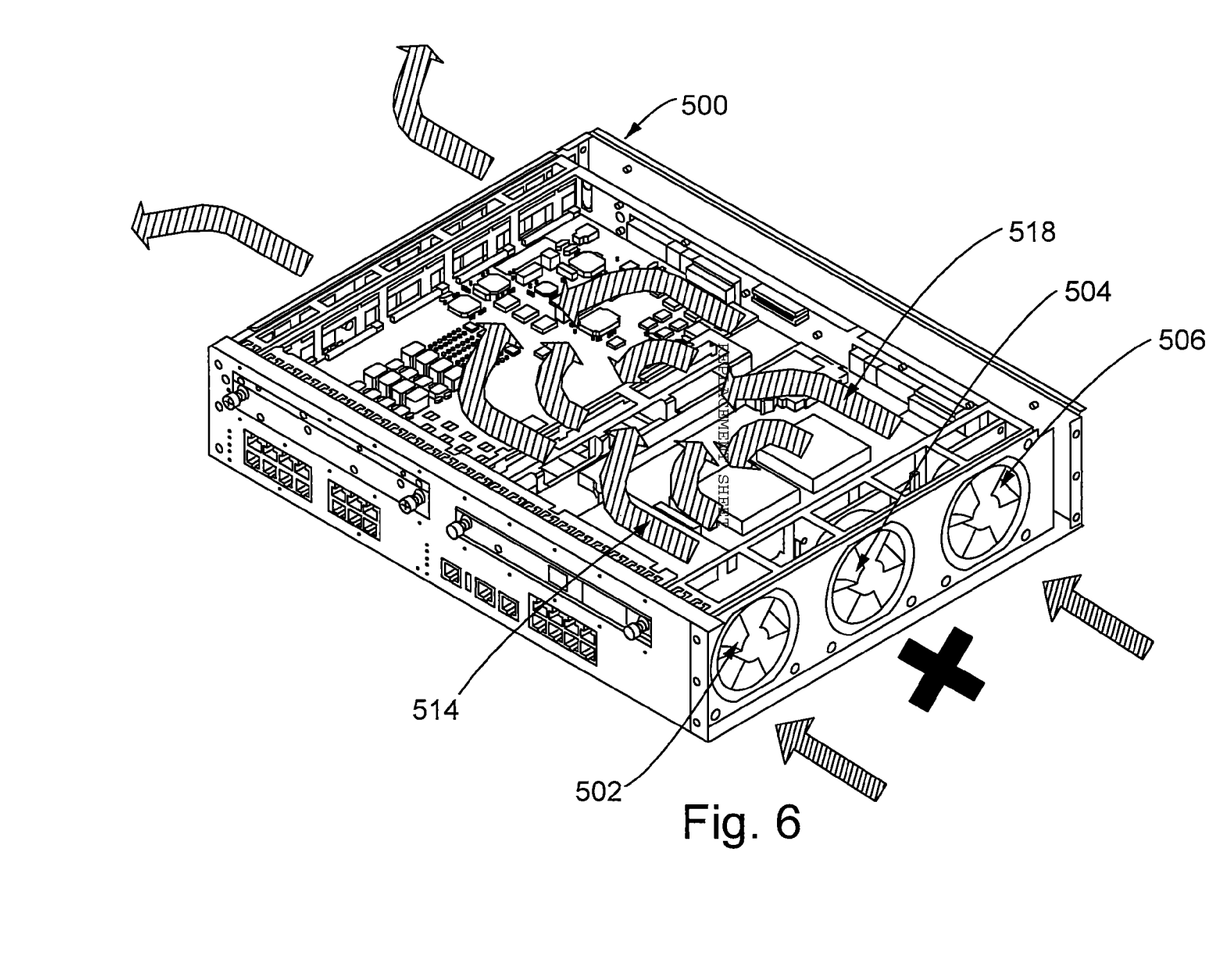
FIG. 6 is a second isometric view of an exemplary chassis showing air flow through the interior of the chassis.

The system 100 operates normally with the fans 175 operating to create air flow through the enclosure. The exemplary enclosure of FIG. 5 shows the enclosure 500 with three fans: fan A 502, fan B 504, and fan C 506. The fans 502, 504, and 506 are each rotating to draw air from the outside environment into the enclosure 500 as represented by arrows 508, 510, and 512. The air is moved through the enclosure 500 generally in a straight stream as represented by arrows 514, 516, and 518. The logic controller 202 of the internal temperature module 200 determines that fan B 504 should be shut off and sends a signal to the Input/output Port 204 for the fan controller 170 in step 404. The fan controller 170 shuts off fan B 504 as shown in FIG. 6. The air flow changes as shown in FIG. 6. In this scenario, the air pushed into the enclosure from fan A 502 and fan C 506 swirl into the middle of the enclosure 500. Simply, the air will fill voids left by fans not in operation. The logic controller 202 of the internal temperature module 200 waits for a predetermined period of time and determines if the sequence is complete in step 408. If the sequence is complete, the method 400 flows YES to step 412. If the sequence is not complete, the method 400 flows NO back to step 408.

Figure 7:
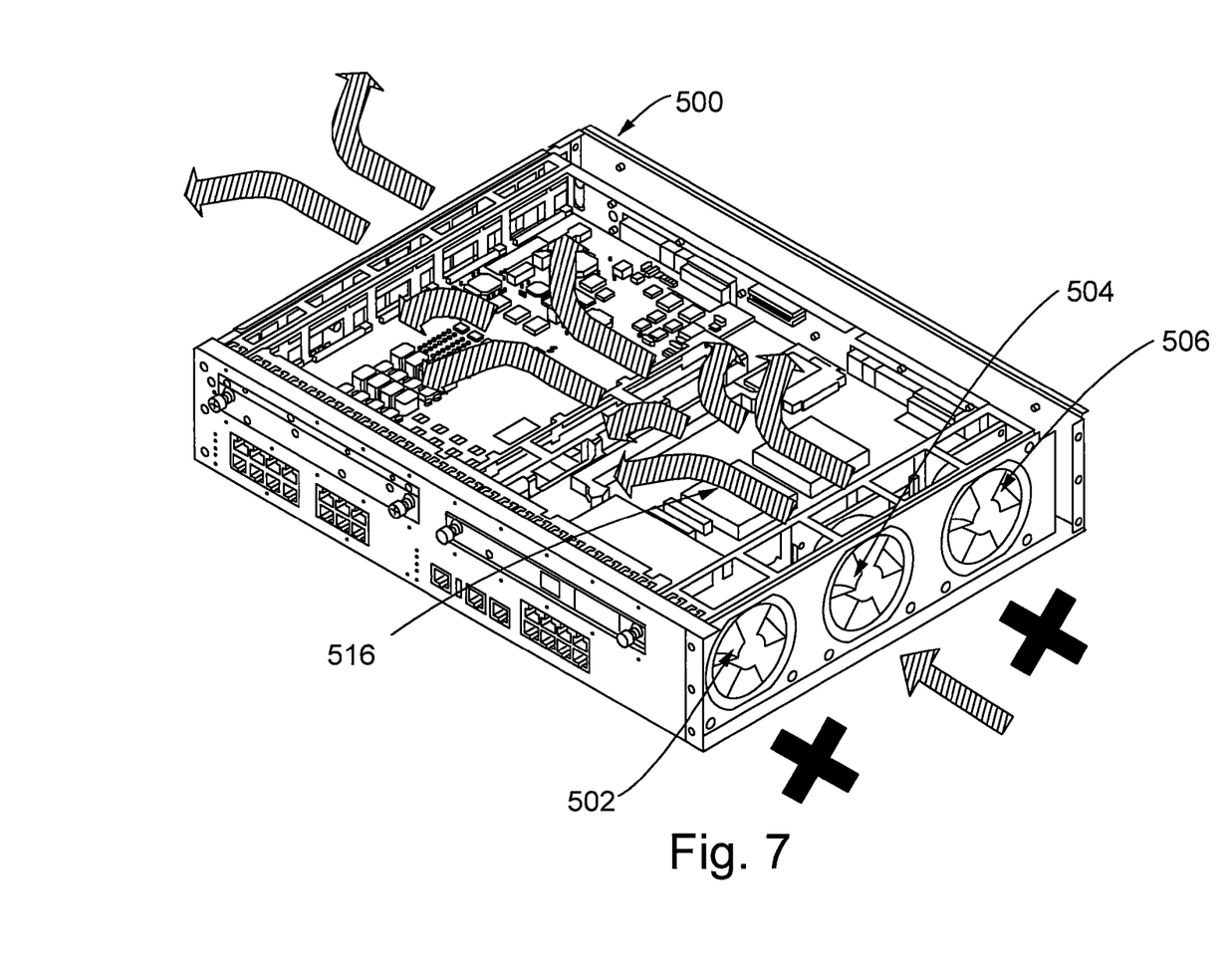
FIG. 7 is a third isometric view of an exemplary chassis showing air flow through the interior of the chassis.

The logic controller 202 of the internal temperature module 200 then decides to turn on fan B 504 again in step 412. Thus, the operation of the fans 502, 504, and 506 returns to normal operation as shown in FIG. 5. Then, the logic controller 202 of the internal temperature module 200 decides, in step 416, to turn off fan A 502 and fan C 506 as shown in FIG. 7. Here, only fan B 504 is operating and the air forced into the enclosures swirls to the outside of the enclosure 500. The logic controller 202 of the internal temperature module 200 waits for a predetermined period of time and determines if the sequence is complete in step 420. If the sequence is complete, the method 400 flows YES to step 424. If the sequence is not complete, the method 400 flows NO back to step 420.

Figure 8:
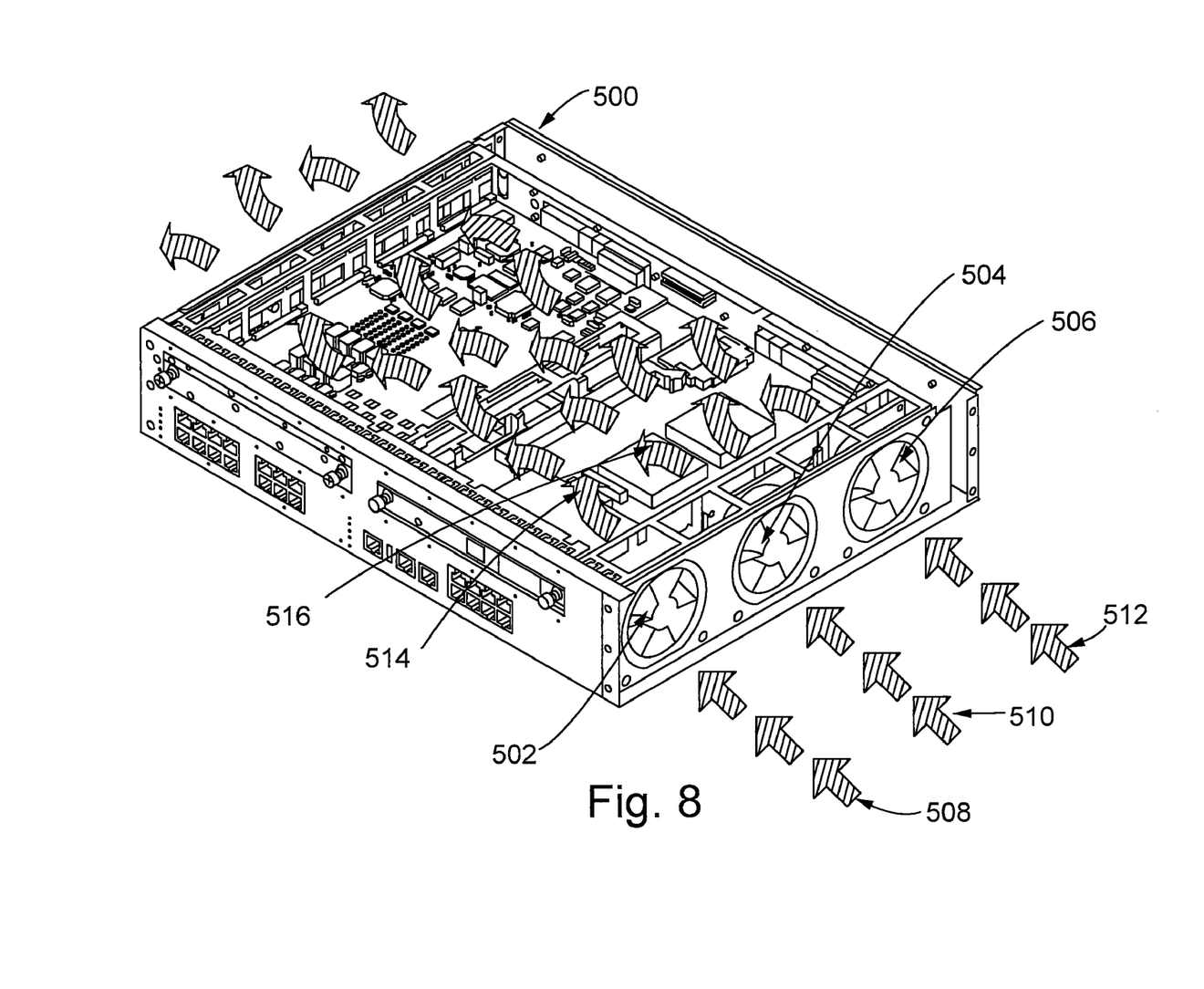
FIG. 8 is a fourth isometric view of an exemplary chassis showing air flow through the interior of the chassis.

Next, the logic controller 202 of the internal temperature module 200 decides to pulse the fans 502, 504, and 506 in step 424 and shown in FIG. 8. Pulsing the fans means repeatedly turning the fan on for a brief period of time (e.g., a second) then turning the fan off for a brief period of time (e.g., a second). Pulsing the fans 502, 504, and 506 causes a turbulent air flow as shown in FIG. 8. The logic controller 202 of the internal temperature module 200 waits for a predetermined period of time and determines if the sequence is complete in step 428. If the sequence is complete, the method 400 flows YES to step 432 where the logic controller 202 of the internal temperature module 200 repeats the pulsing of the fans in step 432. If the sequence is not complete, the method 400 flows NO back to step 428. After step 432, the logic controller 202 of the internal temperature module 200 again determines if the sequence is complete in step 436. If the sequence is complete, the method 400 flows YES to step 440. If the sequence is not complete, the method 400 flows NO back to step 436.

Figure 9:
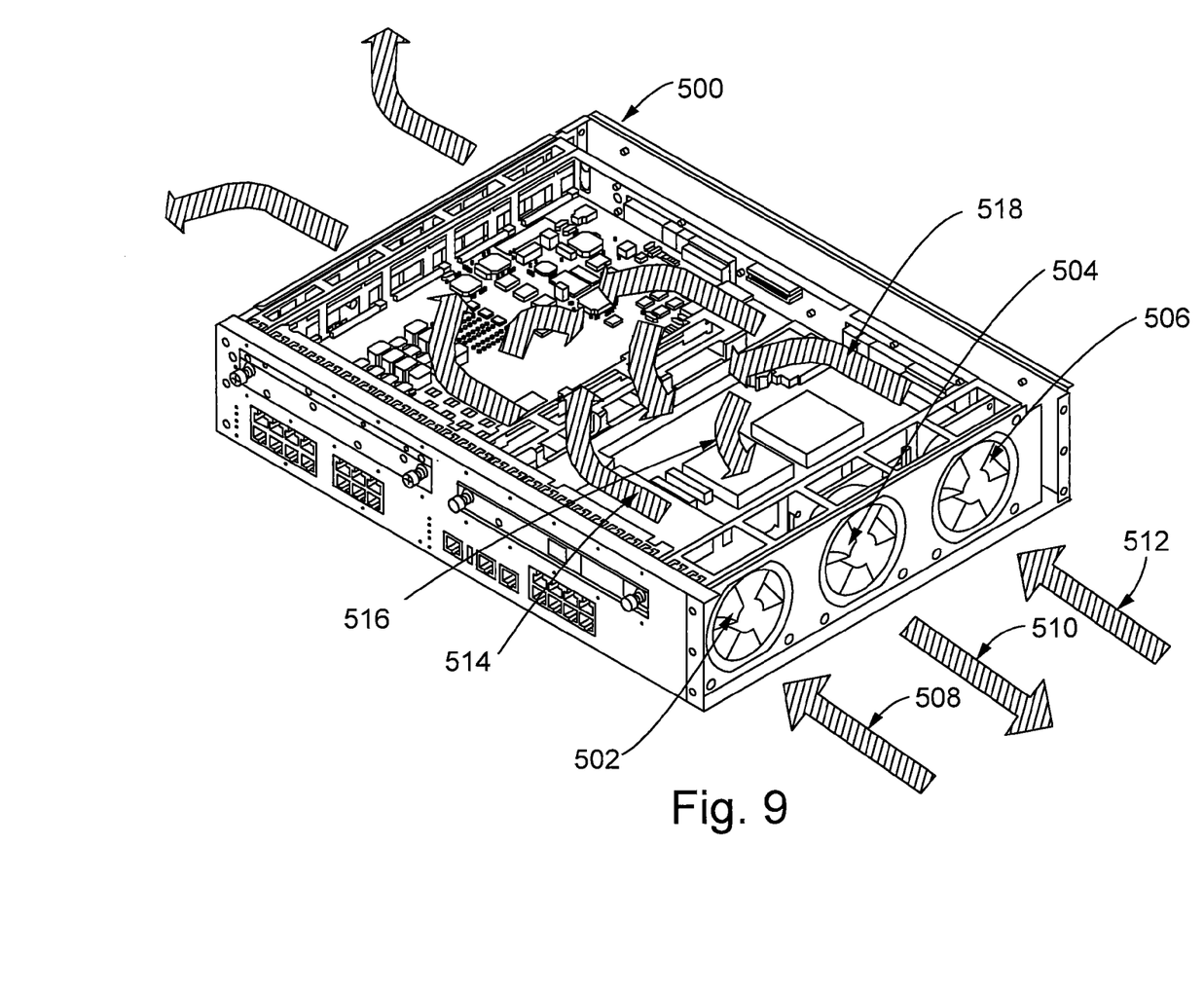
FIG. 9 is a fifth isometric view of an exemplary chassis showing air flow through the interior of the chassis.

The logic controller 202 of the internal temperature module 200 may then turn on fan a 502 and fan C in step 440. Then, the logic controller 202 of the internal temperature module 200 can reverse the direction of fan B 504 as shown in FIG. 9. Here, the fans 502, 504, and 506 can create a powerful eddy or vortex in the enclosure 500 as shown in FIG. 9. Again, the logic controller 202 of the internal temperature module 200 waits for a predetermined period of time and determines if the sequence is complete in step 448. If the sequence is complete, the method 400 flows YES to step 452 where the logic controller 202 of the internal temperature module 200 turns on fan B 504 and returns the system 100 to normal operation as shown in FIG. 5 in step 432. If the sequence is not complete, the method 400 flows NO back to step 448.

This exemplary cleaning cycle shows how manipulating the function of one or more fans can create different air flow patterns. One skilled in the art will be able to determine how to modify the cleaning cycle for good results dependent on the number of fans and the shape and configuration of the enclosure. Further, a cleaning cycle may also be triggered by other sensors, such as a dust monitor. Thus, instead of using temperature a dust sensor 190 may optionally be used, in step 314, to determine a level of dust in the enclosure. If the dust is above a predetermined threshold, the cleaning cycle may be run and the dust level rechecked.

In the foregoing description, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments were described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

While illustrative embodiments of the invention have been described in detail herein, it is to be understood that the inventive concepts may be otherwise variously embodied and employed, and that the appended claims are intended to be construed to include such variations, except as limited by the prior art.

What is claimed is:

1. A temperature management system, comprising:
   a temperature sensor operable to measure a temperature inside an enclosure housing electrical equipment;
   a fan operable to push air through the enclosure;
   a fan controller operable to control the fan;
   an internal temperature module in communication with the temperature sensor and the fan controller, the internal temperature module operable to:
   receive temperature data from the temperature sensor;
   determine if the fan should execute a cleaning cycle;
   direct a cleaning cycle to the fan controller, wherein the cleaning cycle requires the fan to reverse flow and pulse a speed of the fan to change an air flow pattern in the enclosure.

2. The temperature management system as defined in claim 1, comprising a second fan, wherein the fan controller discretely controls each of the fans.

3. The temperature management system as defined in claim 2, wherein the second fan operates differently than the fan during the cleaning cycle.

4. The temperature management system as defined in claim 1, further comprising an on-chip temperature sensor.

5. The temperature management system as defined in claim 1, further comprising a dust sensor.

6. The temperature management system as defined in claim 1, further comprising an air flow sensor.

7. The temperature management system as defined in claim 1, further comprising: a vane operable to direct air flow; a vane controller in communication with the internal temperature module, the vane controller operable to change an orientation of the vane in response to a signal from the internal temperature module.

8. The temperature management system as defined in claim 1, wherein the internal temperature module comprises: a memory operable to store instructions; an input/output port operable to communicate with the temperature sensor and the fan controller; a logic controller in communication with the memory and the input/output port, the logic controller operable to execute troubleshooting for temperature problems and operable to conduct the cleaning cycle.

9. The temperature management system as defined in claim 8, wherein the memory is operable to store temperature data including historic temperature data.

10. A method for managing in an environment of an enclosure for electrical equipment, the method comprising:
    a dust sensor determining if a parameter of the environment within the enclosure for a component is unacceptable, wherein the parameter is a level of dust;
    if the parameter is unacceptable, a temperature sensor determining if the component is at an elevated temperature;
    if the component temperature is at an elevated temperature, an internal temperature module determining if the intake air has a normal temperature;
    if the intake air does not have a normal temperature or if the component has an elevated temperature, the internal temperature module determining if airflow has decreased in the enclosure;
    if airflow has not decreased in the enclosure, the internal temperature module determining if there has been a rise in temperature in the enclosure;
    if there has been a rise in temperature in the enclosure, if there has been a decrease in airflow in the enclosure, or if the intake air has a normal temperature, the internal temperature module determining if the electrical equipment is operating at an acceptable temperature;
    if the electrical equipment is operating at an acceptable temperature, the internal temperature module returning to normal operation; and
    if the electrical equipment is not operating at an acceptable temperature, the internal temperature module running a cleaning cycle for the enclosure, wherein the cleaning cycle comprises separately operating two or more fans in forward, reverse, or pulsing, wherein at least one fan operates differently from one or more other fans.

11. The method as defined in claim 10, wherein the internal temperature module receives temperature data from an on-chip temperature sensor to determine if the component has an elevated temperature.

12. The method as defined in claim 10, wherein the internal temperature module receives temperature data, from the temperature sensor, of the air intake to determine if the air at the intake has an elevated temperature.

13. The method as defined in claim 10, wherein the internal temperature module receives air flow data from an air flow sensor to determine if the airflow has decreased.

14. The method as defined in claim 10, wherein the internal temperature module receives temperature data from the temperature sensor to determine if there has been a rise in temperature or if the electrical equipment is operating at an acceptable temperature.

15. A non-transitory computer program product including computer executable instructions stored onto a computer readable medium which, when executed by a processor of a computer, cause the computer to perform method for conducting a cleaning cycle, the instructions comprising:
    instructions to start the cleaning cycle;
    instructions to operate three fans placed in an enclosure housing electrical equipment to start a first sequence, wherein the first sequence comprises:
    instructions to cause a first fan to operate in a first mode;
    instructions to cause a second fan to operate in a second mode at substantially a same time as the first fan is operating in the first mode; and
    instructions to cause a third fan to operate in the second mode, wherein the first mode and the second mode are different.

16. The computer program product as defined in claim 15, wherein the first mode is stopping the fan and the second mode is normal operation.

17. The computer program product as defined in claim 16, further comprising instructions to operate the fans in a second sequence, wherein the second sequence comprises pulsing all three fans.

18. The computer program product as defined in claim 17, further comprising: instructions to operate the fans in a third sequence, wherein the third sequence comprises: instructions to cause a first fan to operate in reverse; instructions to cause a second fan to operate normally; and instructions to cause a third fan to operate normally.

19. The computer program product as defined in claim 15, further comprising instructions to start the cleaning cycle in response to an elevated temperature inside the enclosure.

20. The computer program product as defined in claim 16, further comprising instructions to start the cleaning cycle periodically.

* * * * *